United States Patent
Iwayama et al.

(10) Patent No.: US 7,727,778 B2
(45) Date of Patent: Jun. 1, 2010

(54) MAGNETORESISTIVE ELEMENT AND METHOD OF MANUFACTURING THE SAME

(75) Inventors: Masayoshi Iwayama, Kawasaki (JP); Keiji Hosotani, Sagamihara (JP); Takeshi Kajiyama, Yokohama (JP); Yoshiaki Asao, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 55 days.

(21) Appl. No.: 12/200,181

(22) Filed: Aug. 28, 2008

(65) Prior Publication Data
US 2010/0053823 A1    Mar. 4, 2010

(51) Int. Cl.
*H01L 21/00* (2006.01)
(52) U.S. Cl. .................. 438/3; 438/48; 257/E21.665
(58) Field of Classification Search ............ 438/3, 438/48, 85, 131; 257/E21.665
See application file for complete search history.

(56) References Cited

U.S. PATENT DOCUMENTS 7,629,182 B2 * 12/2009 Wise .............................. 438/3

FOREIGN PATENT DOCUMENTS

JP    2004-214600    7/2004
JP    2005-79258    3/2005

OTHER PUBLICATIONS

U.S. Appl. No. 12/048,819, filed Mar. 14, 2008, Masayoshi Iwayama.
U.S. Appl. No. 12/107,955, filed Apr. 23, 2008, Masayoshi Iwayama.
U.S. Appl. No. 12/108,093, filed Apr. 23, 2008, Masayoshi Iwayama et al.

* cited by examiner

*Primary Examiner*—Hoai v Pham
(74) *Attorney, Agent, or Firm*—Oblon, Spivak, McClelland, Maier & Neustadt, L.L.P.

(57) ABSTRACT

A magnetoresistive element includes a stack formed by sequentially stacking a first fixed layer in which a magnetization direction is fixed, a first nonmagnetic layer, a free layer in which a magnetization direction is changeable, a second nonmagnetic layer, and a second fixed layer in which a magnetization direction is fixed, a first circumferential wall provided on the second nonmagnetic layer in contact with a circumferential surface of the second fixed layer to surround the second fixed layer, and made of an insulator, and a second circumferential wall provided on the first nonmagnetic layer in contact with a circumferential surface of the free layer to surround the free layer, and made of an insulator.

12 Claims, 10 Drawing Sheets

MAGNETORESISTIVE ELEMENT AND METHOD OF MANUFACTURING THE SAME

BACKGROUND OF THE INVENTION

1. Field of the Invention

The present invention relates to a magnetoresistive element and a method of manufacturing the same, e.g., a magnetoresistive element capable of recording information by supplying a current in two directions, and a method of manufacturing the same.

2. Description of the Related Art

A magnetic random access memory (MRAM) using a ferromagnetic material is expected as a nonvolatile memory that achieves high-speed operation, large capacity, and low power consumption. The MRAM includes a magnetic tunnel junction (MTJ) element using the tunneling magnetoresistive (TMR) effect as a memory element, and stores information in accordance with the magnetization configuration of this MTJ element.

In the conventional MRAM in which data is written by a magnetic field generated by a line current, the coercive force increases as the size of the MTJ element decreases. This often increases a current necessary for data write. In this conventional MRAM, it is difficult to achieve a small cell size for obtaining large capacity and low current at the same time.

A spin-injection-type MRAM using the spin momentum transfer (SMT) write method as a write method that solves the above problem has been proposed. In this spin-injection-type MRAM, information is written by directly supplying a current to the MTJ element, and changing the magnetization direction in a free layer in accordance with the direction of the current. Also, an MTJ element comprising two fixed layers sandwiching a free layer can increase the spin torque. This makes it possible to reduce the critical current density of the MTJ element.

When forming an MTJ element like this, a double magnetic tunnel junction is separated into MTJ elements in an etching step. However, the reaction product formed by etching during junction separation adheres to the side surfaces of the element, and short circuits the free layer and fixed layer. To avoid this short circuit of the free layer and fixed layer, taper etching can be performed. However, the processed sectional shape becomes a tapered shape, and the increase in etching film thickness caused by the two fixed layers increases the processing conversion difference during taper etching. This increases the MTJ element size.

As a related technique of this kind, a technique that improves the characteristics and reliability of an element by preventing the generation of, e.g., a metallic polymer when forming an MTJ cell is disclosed (Jpn. Pat. Appln. KOKAI Publication No. 2004-214600).

BRIEF SUMMARY OF THE INVENTION

According to an aspect of the present invention, there is provided a magnetoresistive element comprising: a stack formed by sequentially stacking a first fixed layer in which a magnetization direction is fixed, a first nonmagnetic layer, a free layer in which a magnetization direction is changeable, a second nonmagnetic layer, and a second fixed layer in which a magnetization direction is fixed; a first circumferential wall provided on the second nonmagnetic layer in contact with a circumferential surface of the second fixed layer to surround the second fixed layer, and made of an insulator; and a second circumferential wall provided on the first nonmagnetic layer in contact with a circumferential surface of the free layer to surround the free layer, and made of an insulator.

According to an aspect of the present invention, there is provided a method of manufacturing a magnetoresistive element, comprising: sequentially stacking a first fixed layer in which a magnetization direction is fixed, a first nonmagnetic layer, a free layer in which a magnetization direction is changeable, a second nonmagnetic layer, and a second fixed layer in which a magnetization direction is fixed; forming a mask layer on the second fixed layer; etching the second fixed layer by using the mask layer as a mask; forming a first circumferential wall made of an insulator on the second nonmagnetic layer and on a circumferential surface of the second fixed layer; etching the second nonmagnetic layer and the free layer by using the first circumferential wall as a mask; forming a second circumferential wall made of an insulator on the first nonmagnetic layer and on circumferential surfaces of the free layer and the second nonmagnetic layer; and etching the first nonmagnetic layer and the first fixed layer by using the second circumferential wall as a mask.

DETAILED DESCRIPTION OF THE INVENTION

Embodiments of the present invention will be explained below with reference to the accompanying drawing. Note that in the following explanation, the same reference numbers denote elements having the same functions and arrangements, and a repetitive explanation will be made only when necessary.

Figure 1:
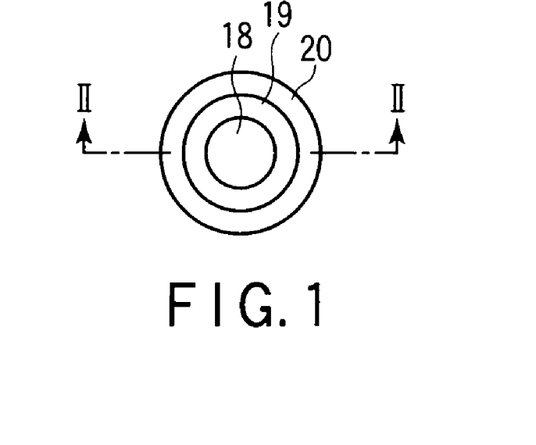
FIG. 1 is a plan view showing the arrangement of an MTJ element 10 according to an embodiment of the present invention.
Figure 2:
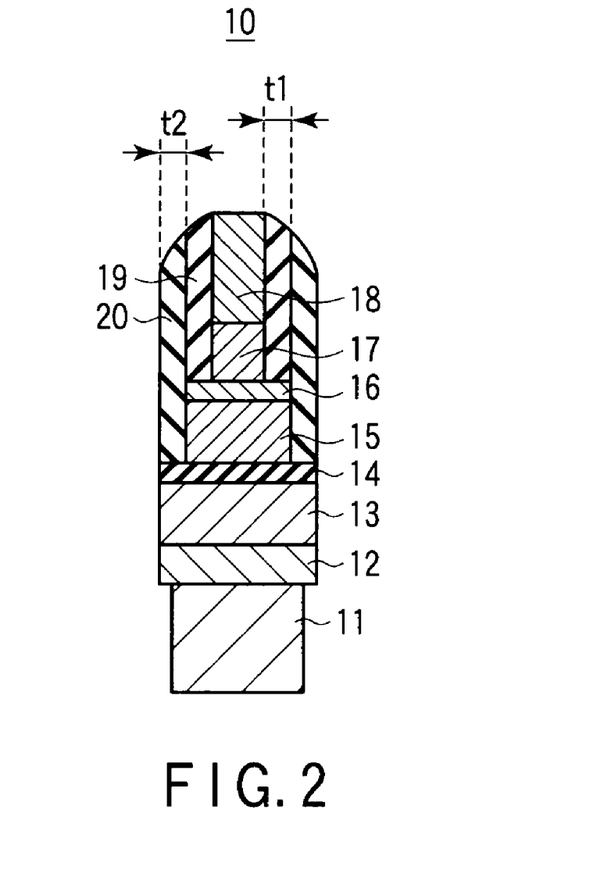
FIG. 2 is a sectional view of the MTJ element 10 taken along line II-II in FIG. 1.

FIG. 1 is a plan view showing the arrangement of an MTJ element (magnetoresistive element) 10 according to an embodiment of the present invention. FIG. 2 is a sectional view of the MTJ element 10 taken along line II-II in FIG. 1.

The MTJ element 10 is formed on a contact plug 11 electrically connected to an interconnection (not shown) used to supply a current. The MTJ element 10 has a stacked structure in which a lower electrode 12, first fixed layer (also called a pinned layer) 13, first tunnel barrier layer (nonmagnetic layer) 14, free layer (also called a recording layer) 15, second tunnel barrier layer (nonmagnetic layer) 16, second fixed layer 17, and upper electrode 18 are sequentially stacked on the contact plug 11.

That is, the MTJ element 10 of this embodiment is an example of the arrangement of a magnetoresistive element having a so-called dual pinned layer structure (in which two fixed layers are formed on nonmagnetic layers on the two sides of a free layer). The planar shape of the MTJ element 10 is not particularly limited. For example, the planar shape is a circle in this embodiment.

The magnetization (or spin) direction is fixed in the first and second fixed layers 13 and 17. Also, the directions of easy magnetization in the first and second fixed layers 13 and 17 are set antiparallel (opposite) to each other. In the free layer 15, the magnetization direction changes (reverses). The directions of easy magnetization in the fixed layers 13 and 17 and free layer 15 can be perpendicular or parallel to the film surfaces. In other words, each of the fixed layers 13 and 17 and free layer 15 can be a perpendicular magnetization film or in-plane magnetization film.

Note that the direction of easy magnetization is a direction that minimizes the internal energy of a certain macro-sized ferromagnetic material if spontaneous magnetization points in the direction without any external magnetic field. The direction of hard magnetization is a direction that maximizes the internal energy of a certain macro-sized ferromagnetic material if spontaneous magnetization points in the direction without any external magnetic field.

The fixed layers 13 and 17 and free layer 15 are made of ferromagnetic materials. More specifically, the fixed layers 13 and 17 are each made of a ferromagnetic material containing one or more elements selected from cobalt (Co), iron (Fe), nickel (Ni), iridium (Ir), platinum (Pt), manganese (Mn), and ruthenium (Ru). The free layer 15 is made of a ferromagnetic material containing one or more elements selected from cobalt (Co), iron (Fe), and nickel (Ni). An element such as boron (B) may also be added to these ferromagnetic materials in order to adjust the saturation magnetization and control the magnetocrystalline anisotropic energy. The lower electrode 12, upper electrode 18, and contact plug 11 are made of a conductor such as tantalum (Ta).

The first tunnel barrier layer 14 is made of a metal oxide such as magnesium oxide (MgO) or aluminum oxide ($AlO_x$). The second tunnel barrier layer 16 is made of a paramagnetic metal such as copper (Cu), gold (Au), or silver (Ag). When the paramagnetic metal is used as the nonmagnetic layer 16, the nonmagnetic layer 16 is called a spacer layer.

The TMR effect can be used when the metal oxide is used as the first tunnel barrier layer 14. The giant magnetoresistive (GMR) effect can be used when the paramagnetic metal is used as the second tunnel barrier layer 16. The MR ratio of TMR is much higher than that of GMR. Accordingly, the MR ratio of TMR is mainly used in data read.

Note that the layers forming the MTJ element 10 may also be stacked in the reverse order. In this case, the paramagnetic metal is used as the first tunnel barrier layer 14, and the metal oxide is used as the second tunnel barrier layer 16. The metal oxide may also be used as both the tunnel barrier layers 14 and 16. If this is the case, the film thicknesses of the tunnel barrier layers 14 and 16 are set different from each other in order to produce an MR ratio difference in data read.

The MTJ element 10 is a spin-injection-type magnetoresistive element. When writing information in the MTJ element 10 or reading information from it, therefore, a current is supplied to the MTJ element 10 in two directions perpendicular to the film surfaces (or stacked surfaces). Information is written in the MTJ element 10 as follows.

When electrons are supplied from the fixed layer 13 (i.e., when electrons flow from the fixed layer 13 to the free layer 15), electrons spin-polarized in the same direction as the magnetization direction in the fixed layer 13 and electrons spin-polarized in the direction opposite to the magnetization direction in the fixed layer 17 as they are reflected by the fixed layer 17 are injected into the free layer 15. In this case, the magnetization direction in the free layer 15 is made the same as that in the fixed layer 13. As a consequence, the magnetization directions in the fixed layer 13 and free layer 15 are parallel. In this parallel arrangement, the resistance of the MTJ element 10 is minimum. This case is defined as binary 0.

On the other hand, when electrons are supplied from the fixed layer 17 (i.e., when electrons flow from the fixed layer 17 to the free layer 15), electrons spin-polarized in the same direction as the magnetization direction in the fixed layer 17 and electrons spin-polarized in the direction opposite to the magnetization direction in the fixed layer 13 as they are reflected by the fixed layer 13 are injected into the free layer 15. In this case, the magnetization direction in the free layer 15 is made opposite to that in the fixed layer 13. Consequently, the magnetization directions in the fixed layer 13 and free layer 15 are antiparallel. In this antiparallel arrangement, the resistance of the MTJ element 10 is maximum. This case is defined as binary 1.

Next, data is read as follows. A read current is supplied to the MTJ element 10. This read current is set at a value (smaller than the write current) at which the magnetization direction in the free layer 15 does not reverse. A sense amplifier senses the change in resistance of the MTJ element 10 in this state.

Note that the stacked structure (including the fixed layer 13, tunnel barrier layer 14, free layer 15, tunnel barrier layer 16, and fixed layer 17) of the MTJ element 10 has a stepwise sectional shape. Circumferential walls 19 and 20 are respectively formed on the two step portions of the stepwise stacked structure. That is, the circumferential wall 19 is formed on the tunnel barrier layer 16 so as to surround the circumferential surfaces of the fixed layer 17 and upper electrode 18 in contact with them. The circumferential wall 20 is formed on the tunnel barrier layer 14 so as to surround the circumferential surfaces of the free layer 15, tunnel barrier layer 16, and circumferential wall 19 in contact with them. The circumferential walls 19 and 20 are made of an insulator such as silicon oxide or silicon nitride.

The outer circumferential surface of the circumferential wall 19 is the same as those of the free layer 15 and tunnel barrier layer 14. The outer circumferential surface of the circumferential wall 20 is the same as those of the fixed layer 13 and tunnel barrier layer 16.

In the sectional shape, the length of the free layer 15 in the film surface direction is less than that of the fixed layer 13 in the film surface direction (or that of the tunnel barrier layer 14 in the film surface direction) by twice the film thickness t2 of the circumferential wall 20. That is, the circumferential surfaces of the fixed layer 13 and free layer 15 are separated by the film thickness t2 of the circumferential wall 20. In other words, the area of the free layer 15 is smaller than that of the fixed layer 13 (or that of the tunnel barrier layer 14). This makes it possible to prevent a short circuit of the fixed layer 13 and free layer 15.

Also, in the sectional shape, the length of the fixed layer 17 in the film surface direction is less than that of the free layer 15 in the film surface direction (or that of the tunnel barrier layer 16 in the film surface direction) by twice the film thickness t1 of the circumferential wall 19. That is, the circumferential surfaces of the free layer 15 and fixed layer 17 are separated by the film thickness t1 of the circumferential wall 19. In other words, the area of the fixed layer 17 is smaller than that of the free layer 15 (or that of the tunnel barrier layer 16). This makes it possible to prevent a short circuit of the free layer 15 and fixed layer 17.

In addition, the circumferential surface of the MTJ element 10 (more specifically, the circumferential surfaces of the fixed layers 13 and 17 and free layer 15) is not tapered but almost perpendicular to the film surfaces. However, the circumferential surface of the MTJ element 10 is actually more or less tapered because the process limitations make perfect perpendicularity impossible.

Furthermore, the size (maximum length in the film thickness direction) of the MTJ element 10 is decreased to a length obtained by adding twice the film thicknesses of the circumferential walls 19 and 20 to the length of the fixed layer 17 in the film surface direction. This makes it possible to make the MTJ element smaller while preventing a short circuit of the magnetic layers.

An example of a method of manufacturing an MRAM including a plurality of MTJ elements 10 will be explained below with reference to the accompanying drawing. FIGS. 3, 5, 8, 10, 13, and 15 are plan views showing manufacturing steps of the MRAM. FIGS. 4, 6, 7, 9, 11, 12, 14, 16, and 17 are sectional views taken along the one-dot dashed lines shown in the plan views, and showing manufacturing steps of the MRAM.

Figure 3:
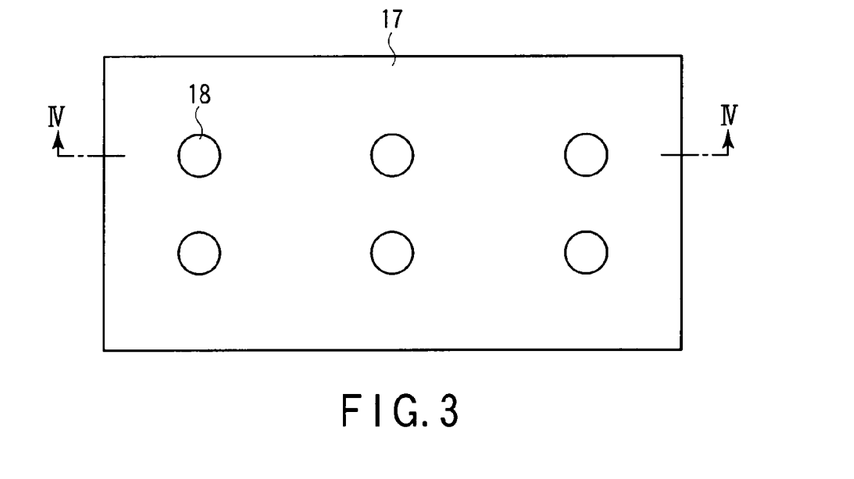
FIG. 3 is a plan view showing a manufacturing step of the MTJ element 10 according to the embodiment of the present invention.
Figure 4:
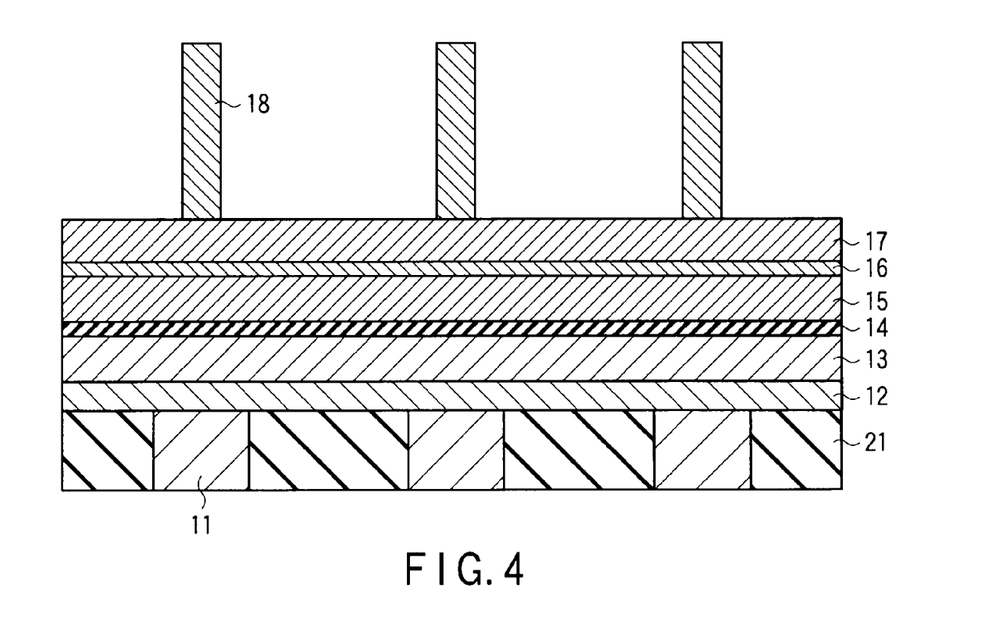
FIG. 4 is a sectional view showing a manufacturing step of the MTJ element 10 taken along line IV-IV in FIG. 3.

A plurality of contact plugs 11 equal in number to the MTJ elements 10 are formed on, e.g., a semiconductor substrate (not shown). An interlayer dielectric layer 21 fills a portion between the contact plugs 11. The interlayer dielectric layer 21 is made of, e.g., silicon oxide. The contact plugs 11 are made of, e.g., tantalum (Ta).

As shown in FIGS. 3 and 4, a lower electrode 12, first fixed layer 13, first tunnel barrier layer 14, free layer 15, second tunnel barrier layer 16, and second fixed layer 17 are sequentially stacked on the plurality of contact plugs 11. The fixed layers 13 and 17 and free layer 15 are made of, e.g., a Co—Fe—B alloy. The first tunnel barrier layer 14 is made of magnesium oxide (MgO), and the second tunnel barrier layer 16 is made of copper (Cu). The lower electrode 12 is made of, e.g., tantalum (Ta).

Subsequently, a plurality of hard masks 18 equal in number to the MTJ elements 10 are formed on the fixed layer 17 by lithography and, e.g., reactive ion etching (RIE). The hard masks 18 are formed to have the same planar shape as that of a desired fixed layer 17. In this embodiment, the planar shape of the hard mask 18 is, e.g., a circle. The hard masks 18 are made of a conductor (e.g., tantalum). In this embodiment, the hard masks 18 are used as upper electrodes.

Figure 5:
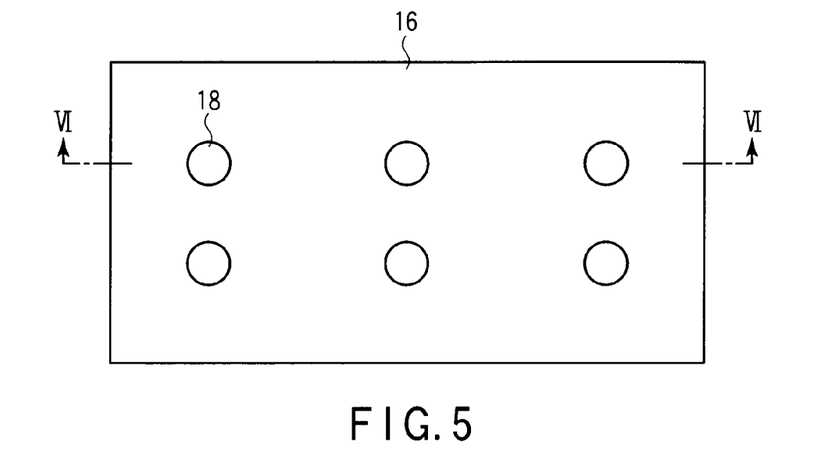
FIG. 5 is a plan view showing a manufacturing step, which follows FIG. 3, of the MTJ element 10.
Figure 6:
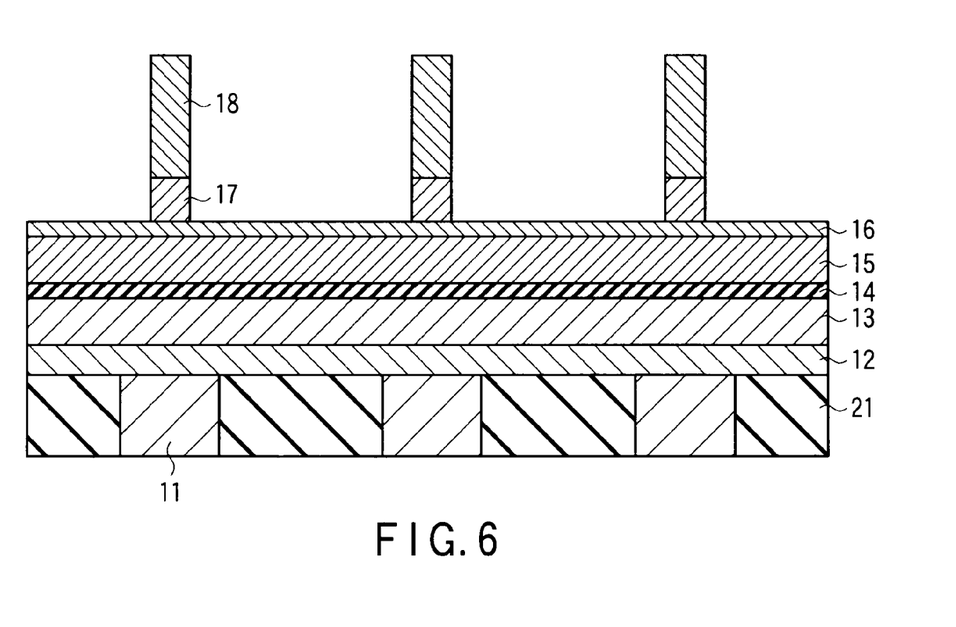
FIG. 6 is a sectional view showing a manufacturing step of the MTJ element 10 taken along line VI-VI in FIG. 5.

Then, as shown in FIGS. 5 and 6, the hard masks 18 are used as masks to etch only the fixed layer 17 by ion milling or the like, thereby exposing the upper surface of the tunnel barrier layer 16.

Figure 7:
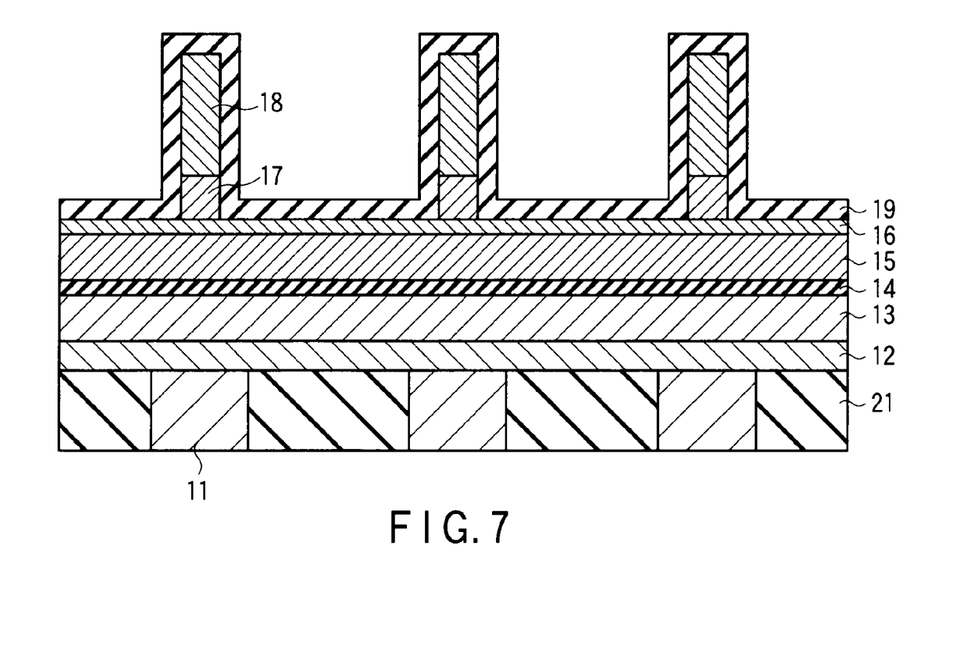
FIG. 7 is a sectional view showing a manufacturing step, which follows FIG. 6, of the MTJ element 10.

As shown in FIG. 7, an insulating film 19 made of silicon nitride is deposited on the entire device surface. This deposition step is performed to form the insulating film 19 on the circumferential surfaces of the fixed layers 17 and hard masks 18.

Figure 8:
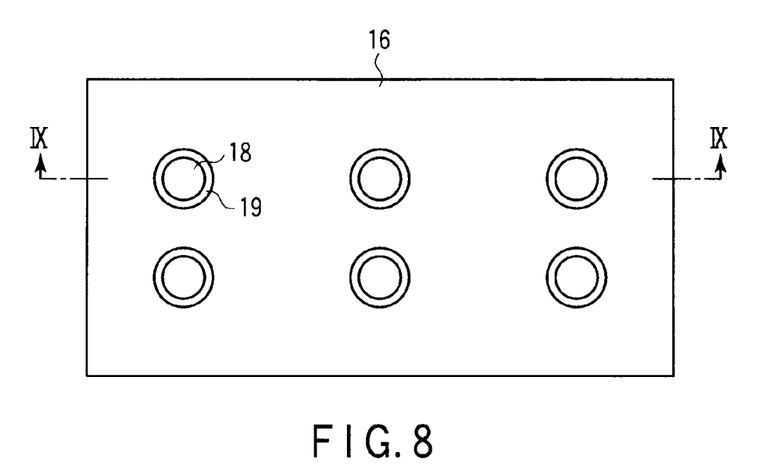
FIG. 8 is a plan view showing a manufacturing step, which follows FIG. 7, of the MTJ element 10.
Figure 9:
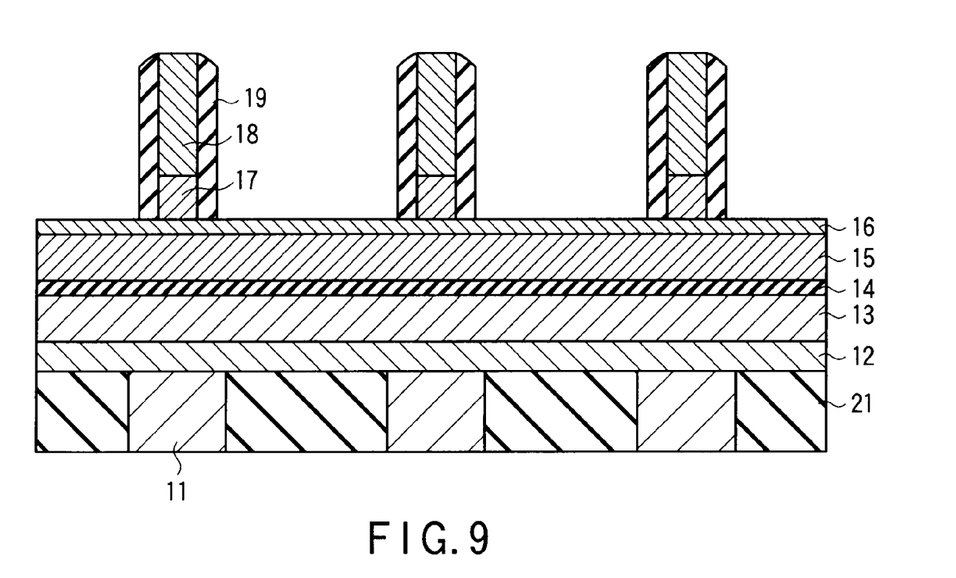
FIG. 9 is a sectional view showing a manufacturing step of the MTJ element 10 taken along line IX-IX in FIG. 8.

As shown in FIGS. 8 and 9, the insulating film 19 is anisotropically etched by, e.g., RIE, thereby exposing the upper surface of the tunnel barrier layer 16. In this step, circumferential walls 19 are formed on the circumferential surfaces of the fixed layers 17 and hard masks 18.

Figure 10:
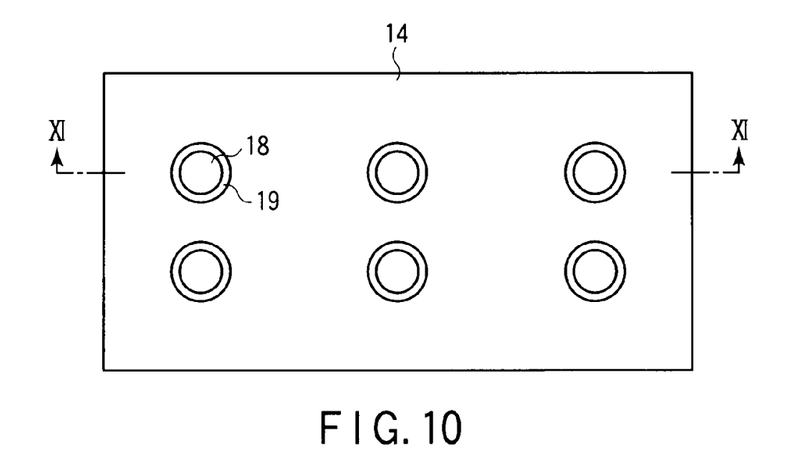
FIG. 10 is a plan view showing a manufacturing step, which follows FIG. 8, of the MTJ element 10.
Figure 11:
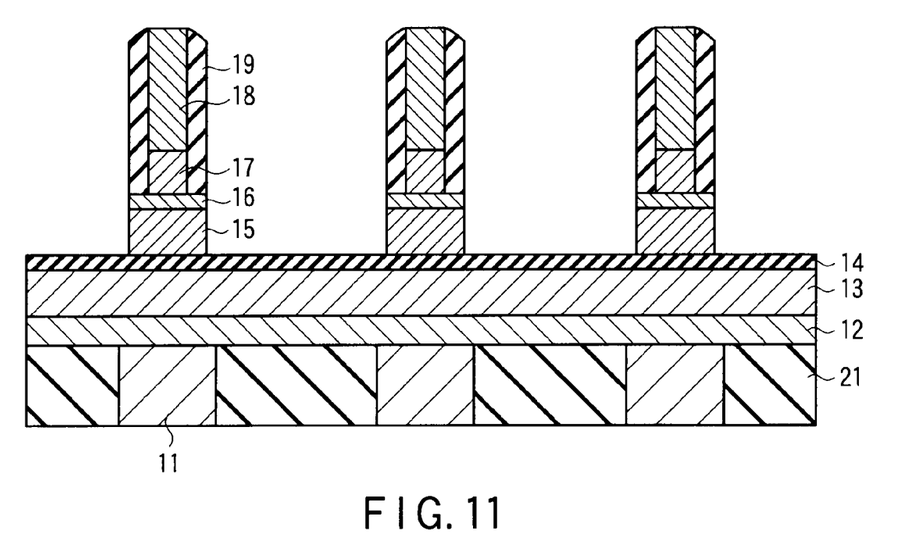
FIG. 11 is a sectional view showing a manufacturing step of the MTJ element 10 taken along line XI-XI in FIG. 10.

As shown in FIGS. 10 and 11, the circumferential walls 19 are used as masks to etch the tunnel barrier layer 16 and free layer 15 by ion milling or the like, thereby exposing the upper surface of the tunnel barrier layer 14. Consequently, the circumferential surfaces of the tunnel barrier layers 16 and free layers 15 are made almost vertical. In this step, the fixed layers 17 are covered with the circumferential walls 19, so it is possible to prevent the reaction product (etching product) formed by etching from adhering to the fixed layers 17. Accordingly, short circuits of the fixed layers 17 and free layers 15 can be prevented.

Figure 12:
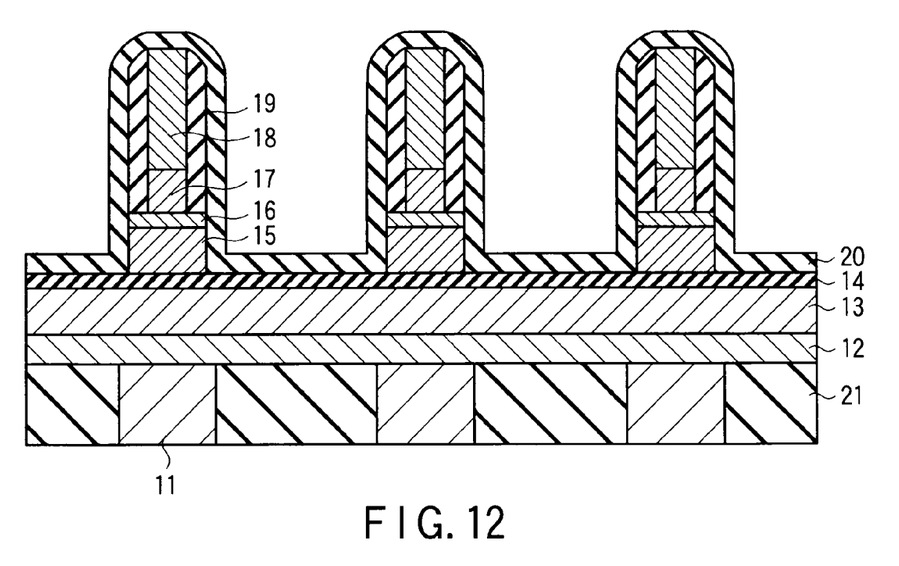
FIG. 12 is a sectional view showing a manufacturing step, which follows FIG. 11, of the MTJ element 10.

Next, as shown in FIG. 12, an insulating film 20 made of silicon nitride is deposited on the entire device surface. This deposition step is performed to form the insulating film 20 on the circumferential surfaces of the free layers 15 and tunnel barrier layers 16.

Figure 13:
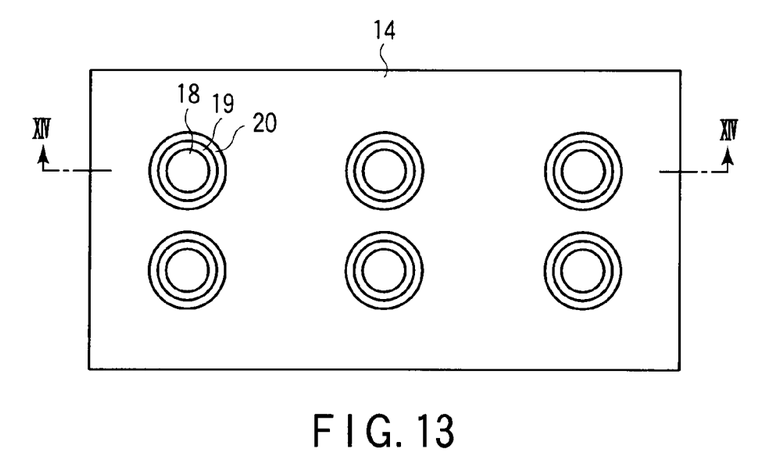
FIG. 13 is a plan view showing a manufacturing step, which follows FIG. 12, of the MTJ element 10.
Figure 14:
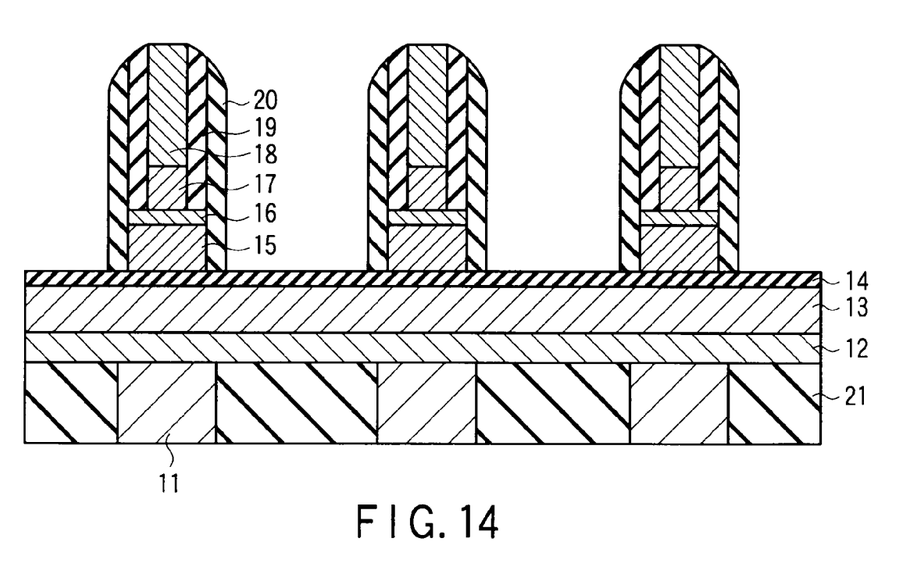
FIG. 14 is a sectional view showing a manufacturing step of the MTJ element 10 taken along line XIV-XIV in FIG. 13.

As shown in FIGS. 13 and 14, the insulating film 20 is anisotropically etched by, e.g., RIE, thereby exposing the upper surface of the tunnel barrier layer 14. Consequently, circumferential walls 20 are formed on the circumferential surfaces of the free layers 15, tunnel barrier layers 16, and circumferential walls 19.

Figure 15:
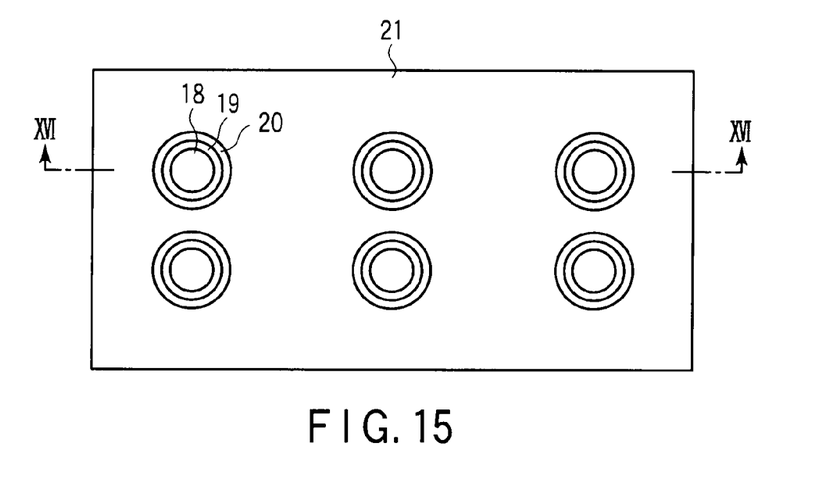
FIG. 15 is a plan view showing a manufacturing step, which follows FIG. 13, of the MTJ element 10.
Figure 16:
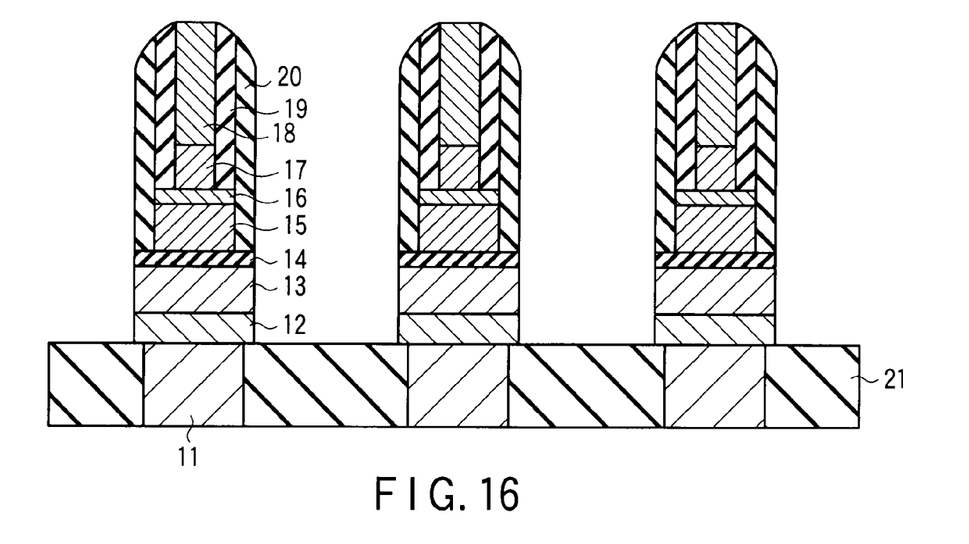
FIG. 16 is a sectional view showing a manufacturing step of the MTJ element 10 taken along line XVI-XVI in FIG. 15.

As shown in FIGS. 15 and 16, the circumferential walls 20 are used as masks to etch the tunnel barrier layers 14, fixed layers 13, and lower electrodes 12 by ion milling or the like, thereby exposing the upper surface of the interlayer dielectric layer 21. In this step, the circumferential surfaces of the tunnel barrier layers 14, fixed layers 13, and lower electrodes 12 are made almost vertical.

In this manner, the MTJ film is separated into a plurality of magnetic tunnel junctions. In this etching step, it is possible to prevent the etching product from adhering to the free layers 15 because the free layers 15 are covered with the circumferential walls 20. Therefore, short circuits of the fixed layers 13 and free layers 15 can be prevented.

Figure 17:
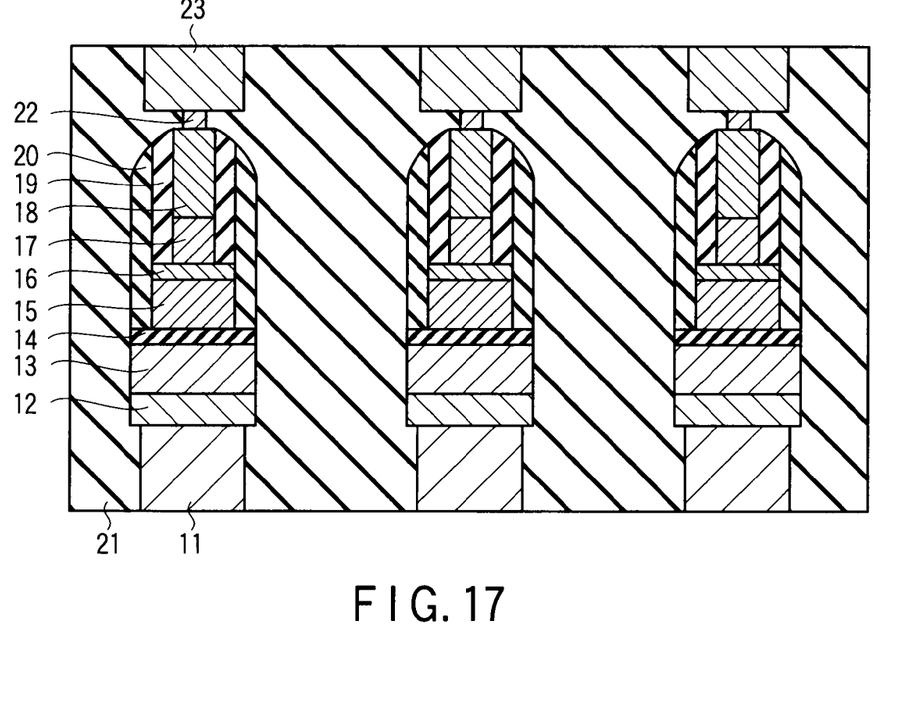
FIG. 17 is a sectional view showing a manufacturing step, which follows FIG. 16, of the MTJ element 10.

Subsequently, as shown in FIG. 17, an interlayer dielectric layer 21 is deposited on the entire device surface. Contact plugs are then formed on the hard masks 18, and interconnections 23 are formed on the contact plugs. In this way, the MTJ elements 10 are formed.

In this embodiment as has been explained in detail above, the circumferential surfaces of the fixed layer 13 and free layer 15 are separated by the film thickness t2 of the circumferential wall 20. To fill this distance, the circumferential wall 20 made of an insulator is formed on the tunnel barrier layer 14 and on the circumferential surface of the free layer 15. Accordingly, a short circuit of the fixed layer 13 and free layer 15 can be prevented.

Similarly, the circumferential surfaces of the free layer 15 and fixed layer 17 are separated by the film thickness t1 of the circumferential wall 19. To fill this distance, the circumferential wall 19 made of an insulator is formed on the tunnel barrier layer 16 and on the circumferential surface of the fixed layer 17. Therefore, a short circuit of the fixed layer 17 and free layer 15 can be prevented.

Also, the size (maximum length in the film thickness direction) of the MTJ element 10 can be decreased to a length obtained by adding twice the film thicknesses of the circumferential walls 19 and 20 to the length of the fixed layer 17 in the film surface direction. This makes it possible to make the MTJ element smaller while preventing short circuits of the magnetic layers. In the MTJ element 10 of this embodiment, the greater the film thicknesses of the fixed layers 13 and 17 and free layer 15, the greater the effect of size reduction, compared with an MTJ element formed using taper etching.

Furthermore, the processing conversion difference (difference between the length of the hard mask 18 in the film surface direction and the length of the MTJ element 10 in the film surface direction) that is the conversion difference when processing the MTJ element 10 by using the hard mask 18 can be reduced to twice the film thicknesses of the circumferential walls 19 and 20.

Also, when the fixed layers 13 and 17 and free layer 15 are in-plane magnetization films, the fixed layer 13 generates a leakage magnetic field. In the MTJ element 10 of this embodiment, however, the circumferential surfaces of the fixed layer 13 and free layer 15 are separated by the film thickness t2 of the circumferential wall 20. This makes it possible to suppress the influence of the leakage magnetic field from the fixed layer 13 on magnetization in the free layer 15. For the same reason, it is possible to suppress the influence of the leakage magnetic field from the fixed layer 17 on magnetization in the free layer 15.

Figure 18:
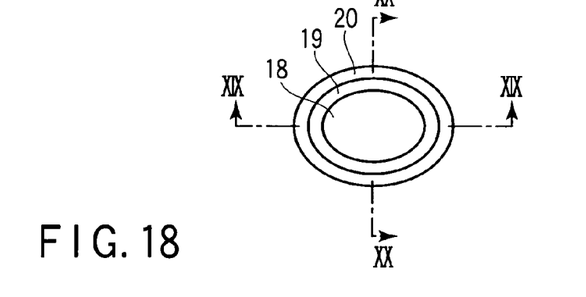
FIG. 18 is a plan view showing another example of the MTJ element 10.
Figure 19:
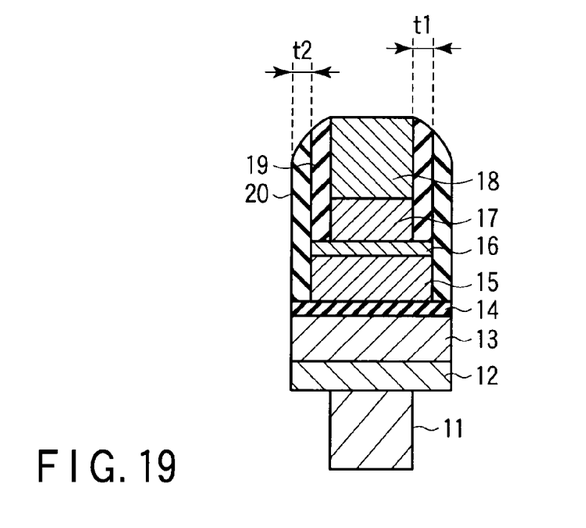
FIG. 19 is a sectional view of the MTJ element 10 taken along line XIX-XIX in FIG. 18.
Figure 20:
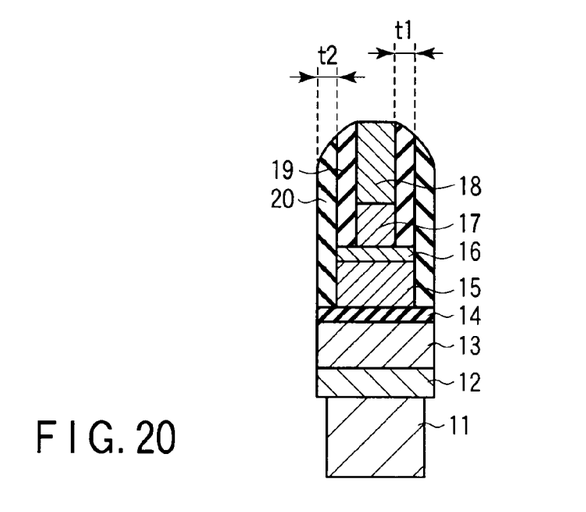
FIG. 20 is a sectional view of the MTJ element 10 taken along line XX-XX in FIG. 18.

Note that the planar shape of the MTJ element 10 is not particularly limited as described previously. The case where the planar shape of the MTJ element 10 is an ellipse will be explained below as another example. FIG. 18 is a plan view showing the other example of the MTJ element 10. FIG. 19 is a sectional view of the MTJ element 10 taken along line XIX-XIX in FIG. 18. FIG. 20 is a sectional view of the MTJ element 10 taken along line XX-XX in FIG. 18.

The planar shapes of the lower electrode 12, first fixed layer 13, first tunnel barrier layer 14, free layer 15, second tunnel barrier layer 16, second fixed layer 17, and upper layer 18 are ellipses. The circumferential wall 19 is formed on the tunnel barrier layer 16 to surround the circumferential surfaces of the fixed layer 17 and upper electrode 18 in contact with them. The circumferential wall 20 is formed on the tunnel barrier layer 14 to surround the circumferential surfaces of the free layer 15 and tunnel barrier layer 16 and circumferential wall 19 in contact with them.

In the sectional shape, the length of the free layer 15 in the film surface direction is less than that of the fixed layer 13 in the film surface direction (or that of the tunnel barrier layer 14 in the film surface direction) by twice the film thickness t2 of the circumferential wall 20 in this case as well. In other words, the area of the free layer 15 is smaller than that of the fixed layer 13 (or that of the tunnel barrier layer 14).

Also, in the sectional shape, the length of the fixed layer 17 in the film surface direction is less than that of the free layer 15 in the film surface direction (or that of the tunnel barrier layer 16 in the film surface direction) by twice the film thickness t1 of the circumferential wall 19. In other words, the area of the fixed layer 17 is smaller than that of the free layer 15 (or that of the tunnel barrier layer 16).

Even when the MTJ element 10 is formed as shown in FIGS. 18 to 20, the same effects as when the planar shape is a circle can be obtained. When forming the MTJ element 10 having an elliptical planar shape as shown in FIGS. 18 to 20, the planar shape of the hard mask 18 need only be made elliptical or rectangular. The rest of the manufacturing process is the same as the manufacturing process described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element comprising:
   a stack formed by sequentially stacking a first fixed layer in which a magnetization direction is fixed, a first nonmagnetic layer, a free layer in which a magnetization direction is changeable, a second nonmagnetic layer, and a second fixed layer in which a magnetization direction is fixed;
   a first circumferential wall provided on the second nonmagnetic layer in contact with a circumferential surface of the second fixed layer to surround the second fixed layer, and made of an insulator; and
   a second circumferential wall provided on the first nonmagnetic layer in contact with a circumferential surface of the free layer to surround the free layer, and made of an insulator.

2. The element according to claim 1, wherein the second circumferential wall is further provided on a circumferential surface of the second nonmagnetic layer.

3. The element according to claim 2, wherein the second circumferential wall is further provided on a circumferential surface of the first circumferential wall.

4. The element according to claim 1, wherein an area of the free layer is smaller than that of the first fixed layer.

5. The element according to claim 1, wherein an area of the second fixed layer is smaller than that of the free layer.

6. The element according to claim 1, wherein an outer circumferential surface of the first circumferential wall is the same as that of the free layer.

7. The element according to claim 1, wherein an outer circumferential surface of the second circumferential wall is the same as that of the first fixed layer.

8. The element according to claim 1, wherein the circumferential surfaces of the first fixed layer, the free layer, and the second fixed layer are substantially perpendicular to film surfaces.

9. The element according to claim 1, further comprising an upper electrode provided on the second fixed layer, and having the same planar shape as that of the second fixed layer.

10. The element according to claim 1, further comprising a lower electrode provided below the first fixed layer, and having the same planar shape as that of the first fixed layer.

11. The element according to claim 1, wherein the first nonmagnetic layer and the second nonmagnetic layer are made of one of a metal oxide and a paramagnetic metal.

12. The element according to claim 1, wherein a planar shape of each of the first fixed layer, the second fixed layer, and the free layer is one of a circle and an ellipse.

* * * * *